(12) United States Patent
Phan et al.

(10) Patent No.: US 6,924,157 B1
(45) Date of Patent: Aug. 2, 2005

(54) REAL TIME PARTICLE MONITOR INSIDE OF PLASMA CHAMBER DURING RESIST STRIP PROCESSING

(75) Inventors: Khoi A. Phan, San Jose, CA (US); Bhanwar Singh, Morgan Hill, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 220 days.

(21) Appl. No.: 10/277,003

(22) Filed: Oct. 21, 2002

(51) Int. Cl.[7] ............................................. H01L 21/00
(52) U.S. Cl. ............................................ 438/8; 438/25
(58) Field of Search ............................ 438/8, 9, 706, 438/710, 714, 723, 724, 725

(56) References Cited

U.S. PATENT DOCUMENTS

| | | | |
|---|---|---|---|
| 4,896,048 A | * | 1/1990 | Borden .................... 250/574 |
| 5,248,636 A | * | 9/1993 | Davis et al. ............. 438/709 |
| 5,401,356 A | * | 3/1995 | Enami et al. ................ 438/5 |
| 6,043,004 A | * | 3/2000 | Kurimoto .................. 430/329 |
| 6,564,811 B2 | * | 5/2003 | Timperio et al. ........... 134/1.2 |

* cited by examiner

Primary Examiner—Kin-Chan Chen
(74) Attorney, Agent, or Firm—Amin & Turocy, LLP

(57) ABSTRACT

One aspect of the present invention relates to a system and method for controlling defect formation during a resist strip process. The system includes a reaction chamber comprising a patterned resist layer overlying a semiconductor structure wherein the resist layer is being exposed to a plasma material flowing into the chamber in order to facilitate removing the resist layer from the structure, a plasma-resist particle monitoring system connected to the reaction chamber and programmed to determine a particle count in the reaction chamber during the resist strip process, and a reaction controller coupled to the chamber and to the monitoring system, the reaction controller being programmed to receive particle data from the monitoring system to facilitate determining whether the counted particles in the chamber are within a tolerable limit. The method involves continuing to expose the structure and the chamber to the plasma until an acceptable particle count is obtained.

14 Claims, 10 Drawing Sheets

REAL TIME PARTICLE MONITOR INSIDE OF PLASMA CHAMBER DURING RESIST STRIP PROCESSING

TECHNICAL FIELD

The present invention generally relates to processing a semiconductor substrate. In particular, the present invention relates to controlling defect formation on a semiconductor wafer during a resist strip process by modifying the resist strip process in order to stabilize and/or reduce defect formation.

BACKGROUND ART

Achieving the objectives of miniaturization and higher packing densities continue to drive the semiconductor manufacturing industry toward improving semiconductor processing in every aspect of the fabrication process. Several factors and variables are involved in the fabrication process. For example, at least one and typically more than one photolithography process may be employed during the fabrication of a semiconductor device. Each factor and variable implemented during fabrication must be considered and improved in order to achieve the higher packing densities and smaller, more precisely formed semiconductor structures.

In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, X-rays, or an electron beam) illuminates selected areas of the surface through an intervening master template, the photoresist mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photoresist mask causes a chemical transformation in the exposed areas of the coating thereby making the image area either more or less soluble (depending on the coating) in a particular solvent developer. The more soluble areas are removed in the developing process to leave the pattern image in the coating as less soluble polymer. The resulting pattern image in the coating, or layer, may be at least one portion of a semiconductor device that contributes to the overall structure and function of the device.

Due to the nature of photolithography, the integrity of each layer within a semiconductor structure must be maintained throughout the fabrication process in order to obtain a properly formed and fully operational device. However, at various stages of a typical fabrication process, defects may be introduced onto a layer and may become an indelible part of the completed device. Although some defects may be detected at or near the completion of fabrication, the repair of such defects consumes resources and reduces manufacturing efficiencies. In addition, some types of defects may not be detectable, let alone repairable, thus leading to increased production costs due to waste.

One example of a prominent type of defect is a defect formed while removing a photoresist layer from a semiconductor structure. The defects result from the interaction between the resist material and other materials employed to remove the photoresist layer. The resist and other materials form particles which may fill the spatial area on, above, and/or around some portion of the semiconductor structure. Therefore, some of the particles are undesirably deposited onto the structure and thus become defects on the structure.

Conventional end-point detection systems may find these defects, however, the detection of them occurs after the device is substantially fabricated. Thus, the conventional detection systems may be problematic for several reasons. In particular, the defects are perpetuated throughout the semiconductor structure, thereby inhibiting proper device performance and function. Hence, there is an unmet need for a system and/or method to mitigate such defects at an earlier stage in the fabrication process.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides a system and method for controlling the formation of defects in real time while a resist layer is being stripped from a semiconductor wafer via a plasma material. In particular, while a semiconductor structure is undergoing a process to remove the resist layer in a chamber, a particle monitor can be programmed to continuously count particles present in and analyze and track the particle counts associated with the chamber. The particle count relates to a number of defects which may adversely affect the structural integrity of the semiconductor structure.

Thus, as the particle count increases to an amount which is intolerable to the semiconductor structure, a reaction time for the resist strip process is modified or extended such that the plasma material may continue to react with the particles in the reaction chamber even after the resist layer has been substantially removed from the wafer. According to an aspect of the present invention, the continued exposure or overexposure of the particles to the plasma material facilitates stabilizing the particles (defects) to thereby reduce and/or eliminate them from the reaction chamber. Once the particle monitor determines that an amount of defects which is tolerable to the structure is present in the chamber, the plasma flow as well as the resist strip process can be terminated.

One aspect of the present invention relates to a system for controlling defect formation during a resist strip process. The system includes a reaction chamber comprising a patterned resist layer overlying a semiconductor wafer wherein the resist layer is being exposed to a plasma material flowing into the chamber in order to facilitate removing at least a portion of the resist layer from the wafer; a plasma-resist particle monitoring system operatively connected to the reaction chamber and programmed to determine a count of particles in the reaction chamber during the resist strip process and to track the particles counted relative to the flow of the plasma material in real time; and a reaction controller operatively coupled to the reaction chamber and to the plasma-resist particle monitoring system, the reaction controller being programmed to receive particle data from the monitoring system to facilitate determining whether the counted particles in the reaction chamber are within a tolerable limit in order to mitigate defect formation on the semiconductor wafer.

Another aspect of the present invention relates to a method for real time reduction of defect formation during a resist strip process in a reaction chamber. The method involves forming a patterned resist layer over a semiconductor wafer, the patterned resist layer having one or more openings therethrough; etching the semiconductor wafer through one or more openings of the patterned resist layer in order to form at least one feature in the semiconductor wafer; exposing the patterned resist layer to a plasma material in order to strip at least a portion of the resist layer from the semiconductor wafer; monitoring particles in the reaction chamber while exposing the patterned resist layer to the plasma material; and continue exposing the semiconductor wafer to the plasma material in order to obtain a desired reduction of defects in the chamber.

According to yet another aspect of the present invention, monitoring the particles within the chamber may provide an indication that the chamber needs to be cleaned prior to a subsequent wafer process. In particular, one or more aspects of the system and method described above may communicate a signal indicating that an average particle count of particles in the chamber measured over the course of a resist strip process is higher than an acceptable average particle count for a reaction chamber. As a result, notification of a relatively dirty chamber may be readily available to a user.

DISCLOSURE OF INVENTION

Figure 1:
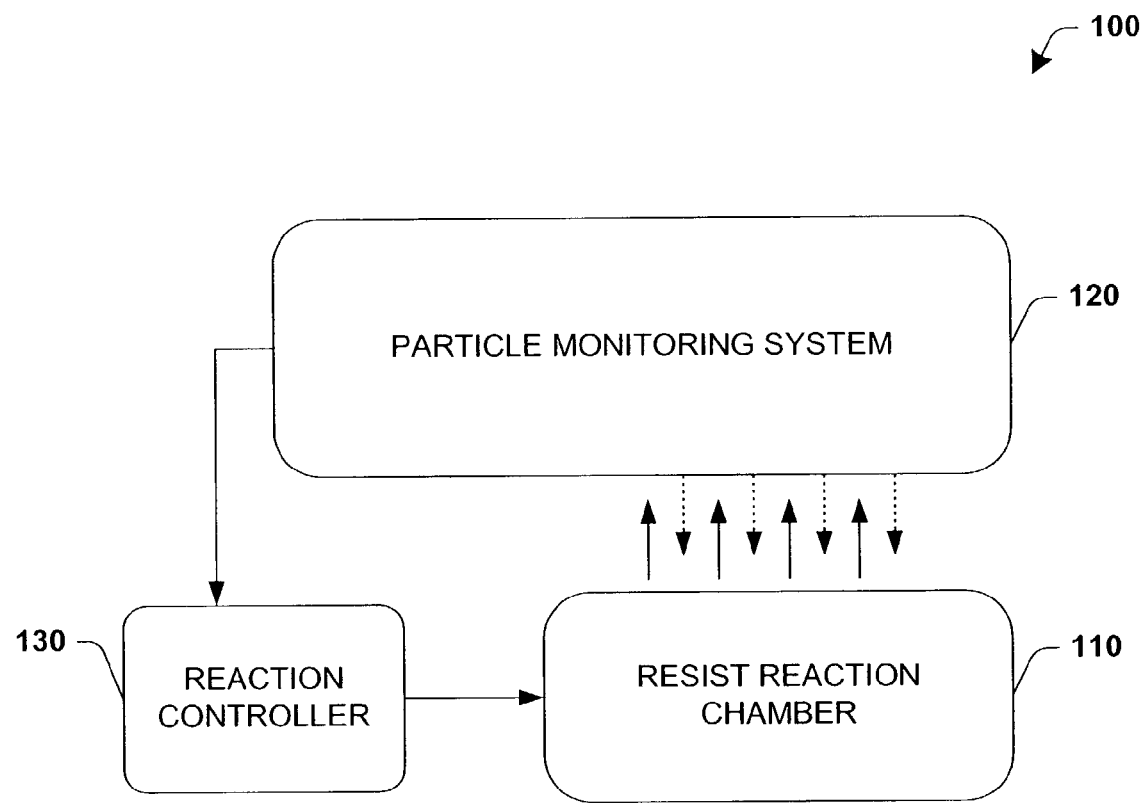
FIG. 1 illustrates a high level, schematic block diagram of a system for controlling defect formation in real time in accordance with an aspect of the present invention.

The present invention involves a system and method for controlling and/or reducing defect formation in real time on a semiconductor structure while the semiconductor structure is undergoing a process to remove a photoresist layer therefrom. More specifically, the present invention provides a system and method which can be programmed to extend a resist strip process in order to stabilize particles which arise as a byproduct of the resist strip process. The process may take place in a chamber such that the particles are contained within the chamber and can adhere to or rest upon some portion of the semiconductor structure and/or some portion of the chamber. Stabilization of the particles effectively allows for their removal from the chamber in order to mitigate and/or reduce the number of particles adhering to the structure.

According to one aspect of the present invention, the particles comprise resist materials and/or plasma materials, or a combination thereof. For example, oxygen ($O_2$) plasma material may be used to strip the resist layer from the semiconductor structure. As the process continues, the chamber environment includes particles of plasma material as well as particles of resist material. The particles of these materials may increase as more of the resist layer is removed from the semiconductor structure. Although the chamber can be configured such that a majority of the particles are evacuated from the chamber, some of the particles may not be expelled from the chamber as desired. The particles which undesirably remain in the chamber during the resist strip process can likely form into or become defects on the semiconductor structure.

In order to mitigate and/or reduce the presence of these unwanted particles in the chamber during the resist strip process, one aspect of the present invention involves monitoring the particles by counting them and providing the particle count in real time to a particle analyzer. The particle analyzer can determine if the particle count is approximating a level of defects which is destructive or intolerable by the semiconductor structure. If and/or when it is determined that the amount of particles (defects) in the chamber are at or near an intolerable level, the resist strip process can be modified. In particular, such modification can be in the form of extending the amount of time that the semiconductor structure and the chamber is exposed to the plasma material. Continued exposure or overexposure of the chamber as well as the semiconductor structure to the plasma facilitates stabilizing the particles so that they can be evacuated from the chamber as desired, thus leaving either no particles or a tolerable amount of particles in the chamber.

The amount of particles tolerable by the semiconductor structure depends on the type of structure and its intended application or use. As soon as the particle monitor recognizes that the amount of particles has fallen to a tolerable number, a termination signal can be communicated to the resist strip process.

Because the system and method of the present invention operate in real time, a particle monitoring system responsible for tracking, counting, and ascertaining whether too many particles remain in the chamber may provide data associated with the particle counts, amounts of plasma material supplied to the chamber, rate of plasma flow, and the like in a continuous manner. The data may also be plotted as it is obtained by the monitoring system in order to provide a visual aide to a user. By graphing the data, it should be apparent to the user that the number of defects or particles decreases as the plasma exposure time increases.

The present invention will now be described with respect to an exemplary semiconductor structure as demonstrated in FIGS. 1–11 below. The exemplary semiconductor structure is described below as having a patterned resist layer thereon. However, it should be appreciated that the resist layer need not be patterned and such is intended to fall within the scope of the present invention.

FIG. 1 depicts a system 100 for controlling an amount of particles present in a resist reaction chamber 110 in accordance with one aspect of the present invention. The system 100 includes the resist reaction chamber 110 in which a resist strip process is occurring. The resist strip process involves removing a resist layer from at least a portion of a semiconductor structure using a plasma material. As the resist strip process continues, particles may form in the chamber 110. Not all of the particles may be expelled from the chamber 110 as desired. Thus, a particle monitoring system 120 may also be included in the system 100. The particle monitoring system 120 counts the particles present in the chamber 110 over the course of the resist strip process. That is, the counting of the particles occurs in real time as the strip process progresses. The particle monitoring system 120 is operatively connected to the chamber 110 in order to count the particles and track the number of particles counted in relation to a length of time the chamber and the structure have been exposed to the plasma.

In addition, the particle monitoring system 120 determines whether the particle count exceeds an amount of defects which the structure can tolerate without experiencing diminished performance and/or function. If the particle count does reach an intolerable number of defects, the particle monitoring system 120 can communicate the related data and/or information to a reaction controller 130. The reaction controller 130 is coupled to the particle monitoring system 120 as well as to the chamber 110 and can instruct the chamber 110 to extend the resist strip process such that the chamber continues to receive the plasma material. The plasma material facilitates stabilizing the particles in order to transform them into a disposable product which can be expelled by the chamber 110. Thus, fewer particles are present in the chamber 110, thereby resulting in fewer defects forming on the structure.

Figure 2:
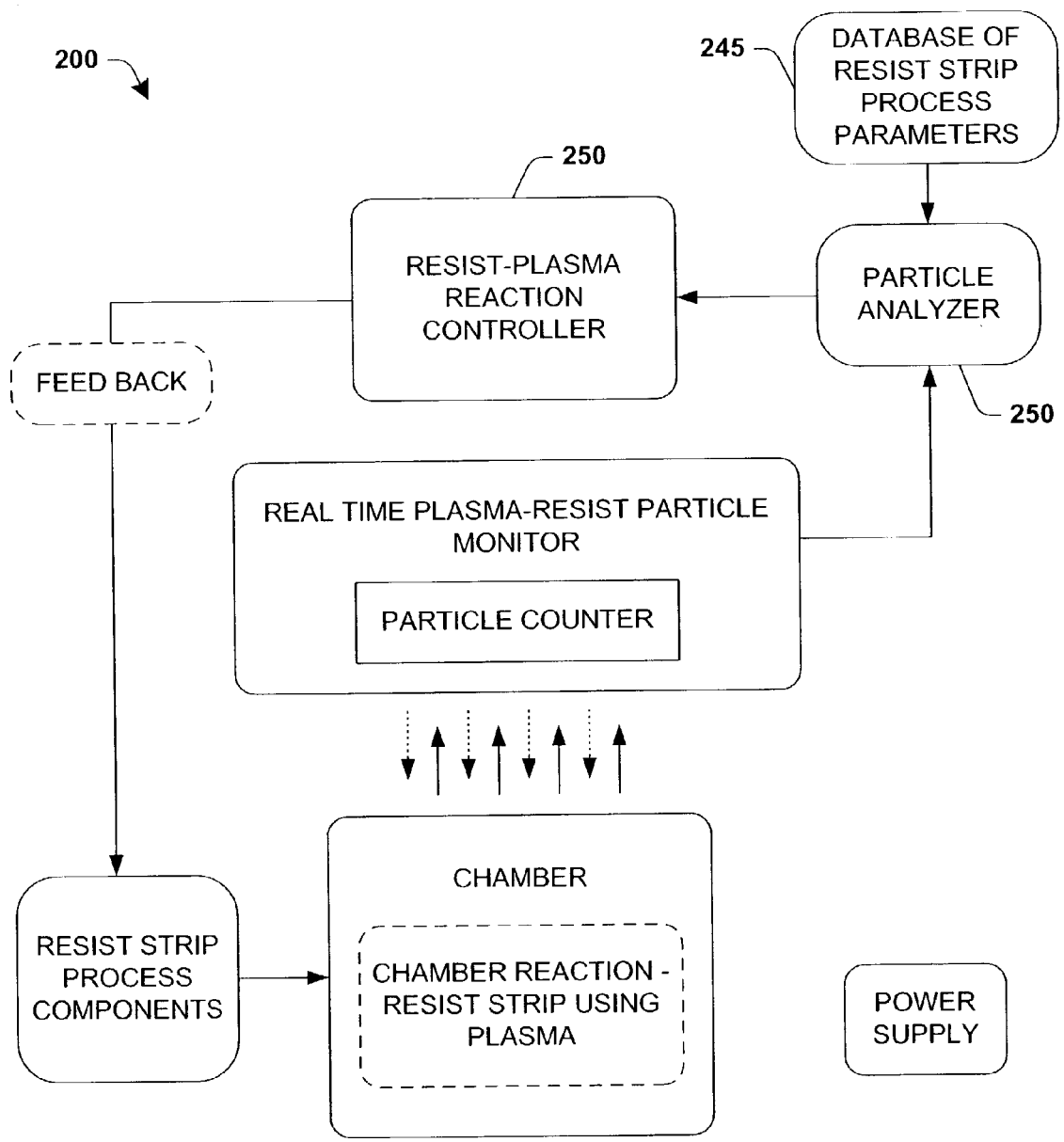
FIG. 2 illustrates a schematic block diagram of a system for controlling defect formation in real time in a reaction chamber during a resist strip process in accordance with an aspect of the present invention.

FIG. 2 illustrates a system 200 for reducing defect formation during a resist strip process in real time in accordance with another aspect of the present invention. The system 200 includes a chamber 210 in which a chamber reaction 215 occurs between a plasma material and a resist material which is to be removed at least in part a semiconductor structure. The plasma material can be used to remove at least a portion of a patterned resist layer which overlays a semiconductor structure. The reaction that occurs during the resist strip process may yield undesirable byproducts or particles. The particles may comprise a resist material and/or a plasma material, which when found together can indicate that a reaction between the two materials did not occur properly. The particles can correspond to defects, and in particular, defects capable of impairing the function of the semiconductor structure.

In order to mitigate defect formation on the semiconductor structure during the resist strip process, the system 200 includes a real time plasma-resist particle monitor 220 connected to the chamber 210 such that data from the chamber 210 may be transmitted (solid arrows) to the monitor 220. The particle monitor 220 comprises a particle counter 230 which can be programmed to sense and count (dotted arrows) the particles present in the chamber 210 on a real time basis so that this data may be presented to the system 200 and/or to a user for an immediate response or for immediate use by the system 200 and/or by the user.

The system 200 also includes a particle analyzer 240. The particle analyzer receives the data from the particle monitor 220, and in particular, from the particle counter 230, and processes such data in order to determine whether the particles in the chamber 210 exceed a tolerable count. The particle analyzer 240 can determine this by comparing the particle data to a database 245 of resist strip process parameters which may include tolerable particle counts for various types of devices. The amount of particles which can be tolerated by the semiconductor structure depends on the type of structure and the overall type of device being fabricated at the present time.

The information produced by the particle analyzer 240 can be communicated to a plasma-resist reaction controller 250. The reaction controller 250 regulates and controls the resist strip process reaction 215 as it occurs in the reaction chamber 210 via one or more resist strip process components 260. In particular, the reaction controller 250 receives information generated by the analyzer 240. Such information may indicate whether the most recently obtained particle count is greater than a prescribed tolerable amount of particles for the particular device being manufactured.

The controller 250 employs this information (feedback 270) by either communicating it to the one or more components 260 or by transforming it into usable instructions directed to the one or more components 260 for immediate implementation. Examples of the one or more resist strip process components include at least one of plasma type, temperature, pressure, flow rate, exposure time, and power.

Moreover, the system 200 utilizes controlled feedback 270 in order to communicate to the one or more components 260 responsible for carrying out the resist strip process to continue the plasma exposure (a component) beyond a pre-programmed time limit and/or extend the plasma exposure time in order to stabilize and reduce the number of particles counted in the chamber 210.

Therefore, when the controller communicates information indicating that the particle count is essentially at an intolerable level, one or more components may be adjusted in order to extend the resist strip process beyond the pre-set reaction length. In particular, the interior of the chamber 210 including the semiconductor structure may be subjected to a prolonged plasma exposure in order to facilitate an evacuation of the particles present in the chamber 210. The particle count may increase as more of the resist layer is removed from the semiconductor structure. Hence, plasma may be supplied to the chamber 210 in order to reduce the particle count even though the resist layer has been substantially removed from the semiconductor structure. The plasma may be supplied to the chamber at a constant rate or at increasing rates which are suitable to carry out the present invention without damaging the semiconductor structure.

A power supply 280 such as a suitable battery or otherwise can be used to effectively and efficiently operate the system 200.

Figure 3:
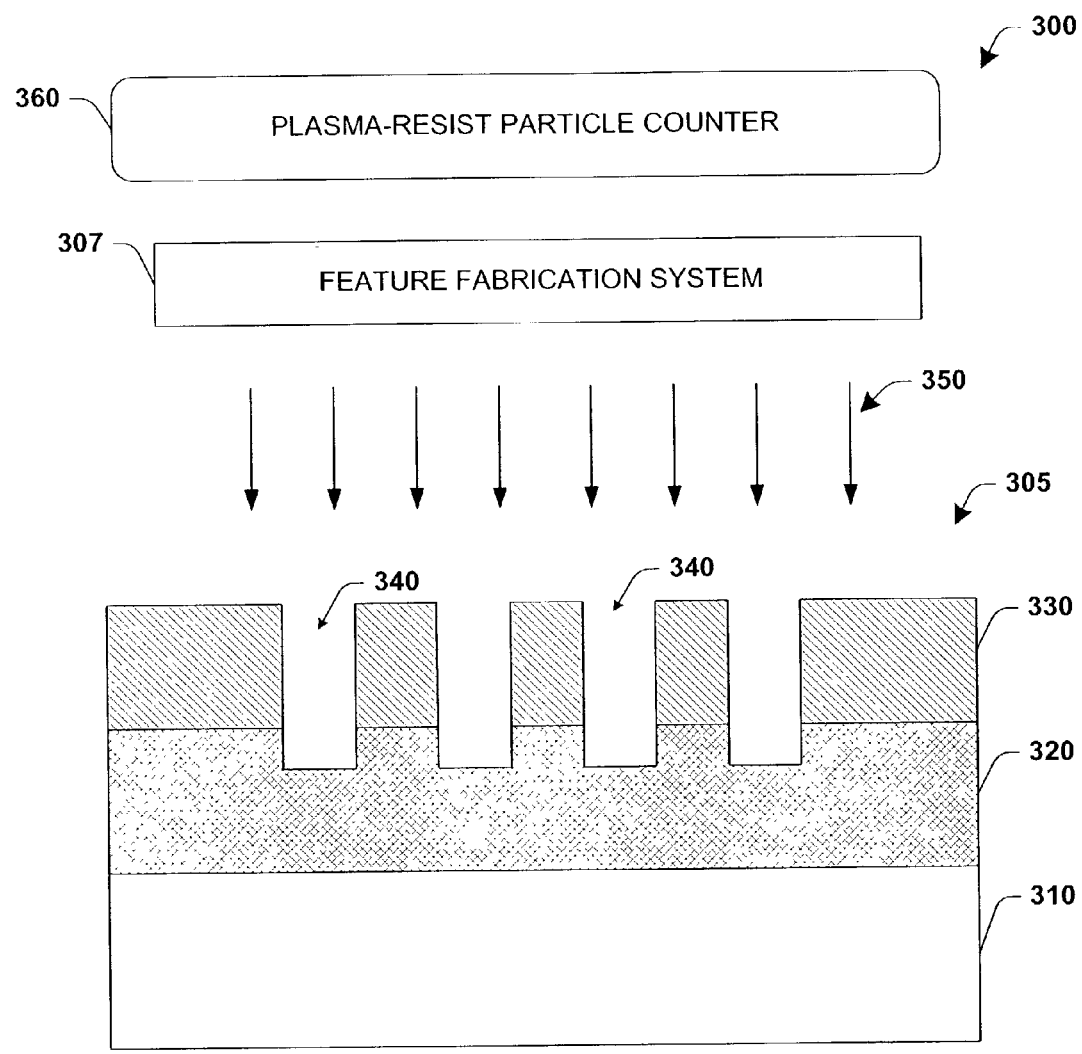
FIG. 3 illustrates a schematic, cross-sectional view of a semiconductor structure having at least one feature formed therein in accordance with an aspect of the present invention.

Turning now to FIG. 3, a partial view of a system 300 for controlling defect formation during a resist strip process is shown. FIG. 3 depicts a schematic, cross-sectional view of a semiconductor structure 305 undergoing a fabrication process by a feature fabrication system 307. In particular, the semiconductor structure 305 includes a substrate 310 and at least one material layer 320 which may comprise any one of a metal, non-metal, organic and/or inorganic material, or a combination there of. The structure 305 may also include one or more material layers 320. The uppermost layer on the structure 305 is a patterned photoresist layer 330. The patterned photoresist layer 330 comprises one or more openings 340 therethrough which correspond to one or more features to be formed in the underlying layer 320. Examples of the features being formed in the structure 305 include vias, contacts, plugs, capacitors, trenches, and the like.

As shown in FIG. 3, the feature fabrication system 307 is etching (350) the material layer 320 through the one or more openings 340 of the photoresist layer 330. The system 300 also includes a plasma-resist particle counter 360. Because the semiconductor structure 305 has not yet entered a resist strip process phase, the particle counter 360 may sit idle until it is activated or signaled by resist strip process components.

Figure 4:
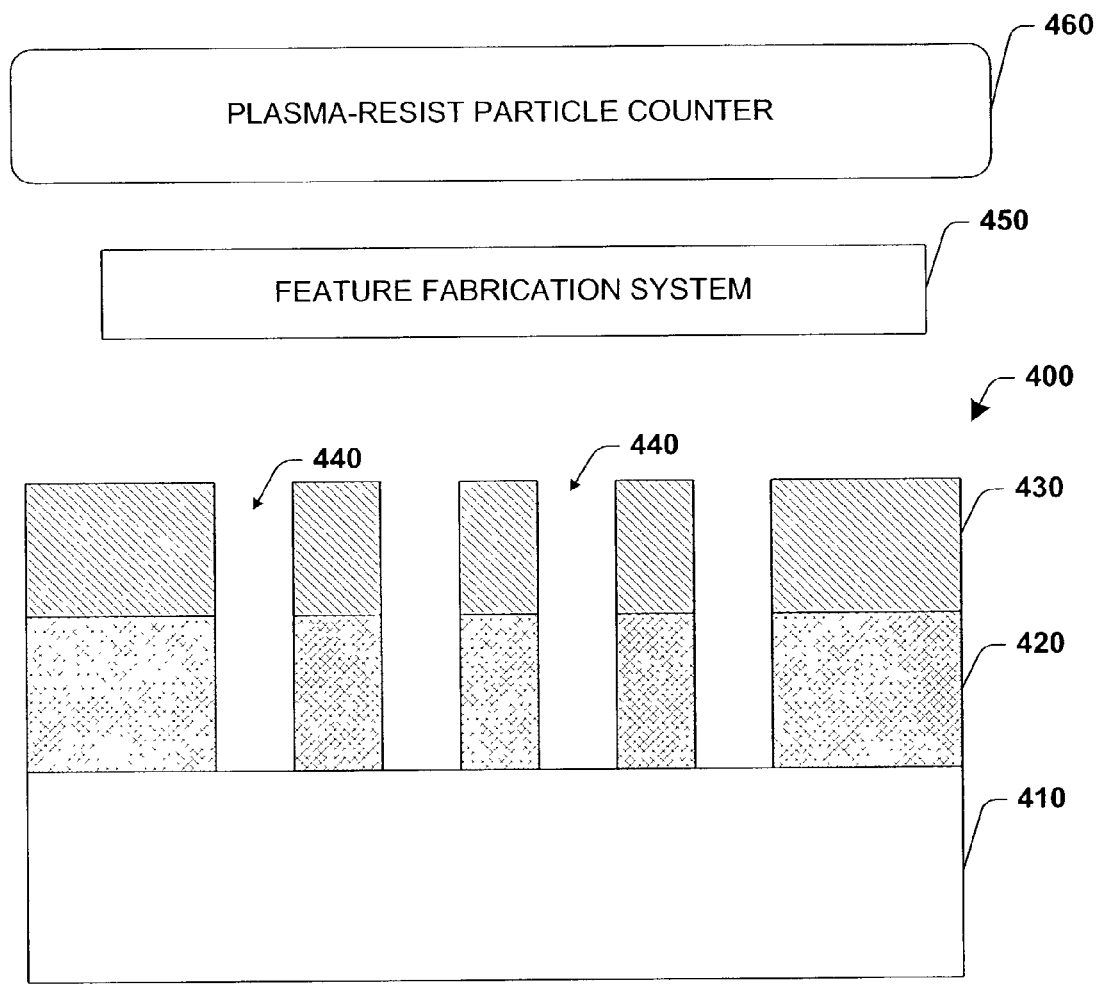
FIG. 4 illustrates a schematic, cross-sectional view of a semiconductor structure showing at least one feature substantially formed therein in accordance with an aspect of the present invention.

FIG. 4 is similar to the system represented in FIG. 3. A semiconductor structure 400 has been substantially etched and developed. The structure 400 includes a silicon substrate 410, one or more intermediate layers 420, and a patterned photoresist layer 430 as the uppermost layer. The patterned photoresist layer 430 comprises one or more openings 440 which have been transferred to the underlying intermediate layer 420 by some suitable aspect of a feature fabrication system 450. A plasma-resist particle counter 460 can remain idle until the semiconductor structure 400 is subjected to a process for removing the patterned photoresist layer 430 therefrom.

Figure 5:
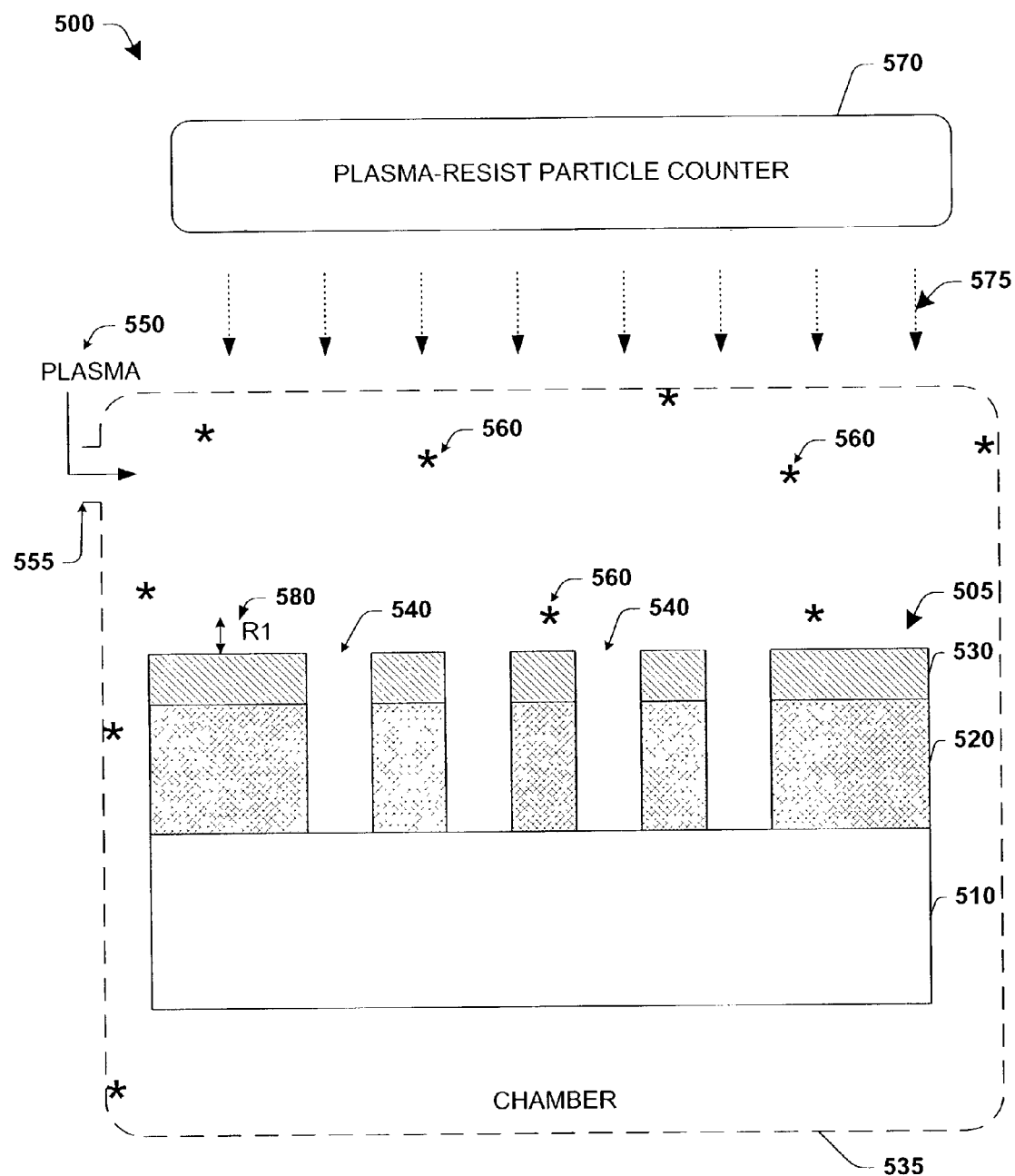
FIG. 5 illustrates a schematic, cross-sectional view of a semiconductor structure having at least one feature formed therein undergoing a process to strip the photoresist layer therefrom in a reaction chamber in accordance with an aspect of the present invention.

FIG. 5 depicts a system 500 for controlling defect formation on a semiconductor structure 505 similar to the structure 400 described in FIG. 4 during a resist strip process. The structure includes a silicon substrate 510, one or more intermediate layers 520 which have been substantially etched to reveal one or more features therein, and a patterned photoresist layer 530 as the uppermost layer of the structure 505. The patterned photoresist layer 530 comprises one or more openings 540 which have been transferred to the underlying intermediate layer 520 by a feature fabrication system 450 (FIG. 4).

According to FIG. 5, the resist strip process is taking place within a reaction chamber 535. That is, the semiconductor structure 505 is housed and held inside of the reaction chamber 535 throughout the resist strip process. In order to remove at least a portion of the patterned resist layer 530 from the semiconductor structure 505, a plasma material 550 is employed and introduced into the chamber 535 via a valve 555 or related type of controllable flow mechanism. The plasma material 550 may comprise oxygen, for example.

As shown in FIG. 5, a portion R1 580 of the resist layer 530 has been stripped away from the structure 505. The resist strip process involves a reaction between the resist material and the plasma material such that chemical bonds are disrupted and/or broken such that the resist material may be gradually removed from the semiconductor structure without causing damage to the structure. However, some resist material particles and plasma particles 560 do not properly react together. As a result, they 560 cannot be expelled from the chamber 535 as are the majority of the particles. The particles 560 that remain in the chamber correspond to a number of defects 560 which may potentially contaminate the semiconductor structure 505. For example, the defects 560 may eventually settle and/or deposit themselves on the semiconductor structure 505. They may remain there throughout the fabrication process and ultimately render the manufactured device inoperable or substandard for commercial use.

Since some defects can be tolerated by the semiconductor structure 505 (or final device), a plasma-resist particle counter 570 may be employed while the resist strip process takes place to monitor 575 a particle count of the particles 560 present in the chamber 535. Data relating to the particle count can then be transmitted to a particle analyzer (FIG. 2) to determine whether the present particle count exceeds an acceptable or tolerable particle limit for the particular device being fabricated.

Figure 6:
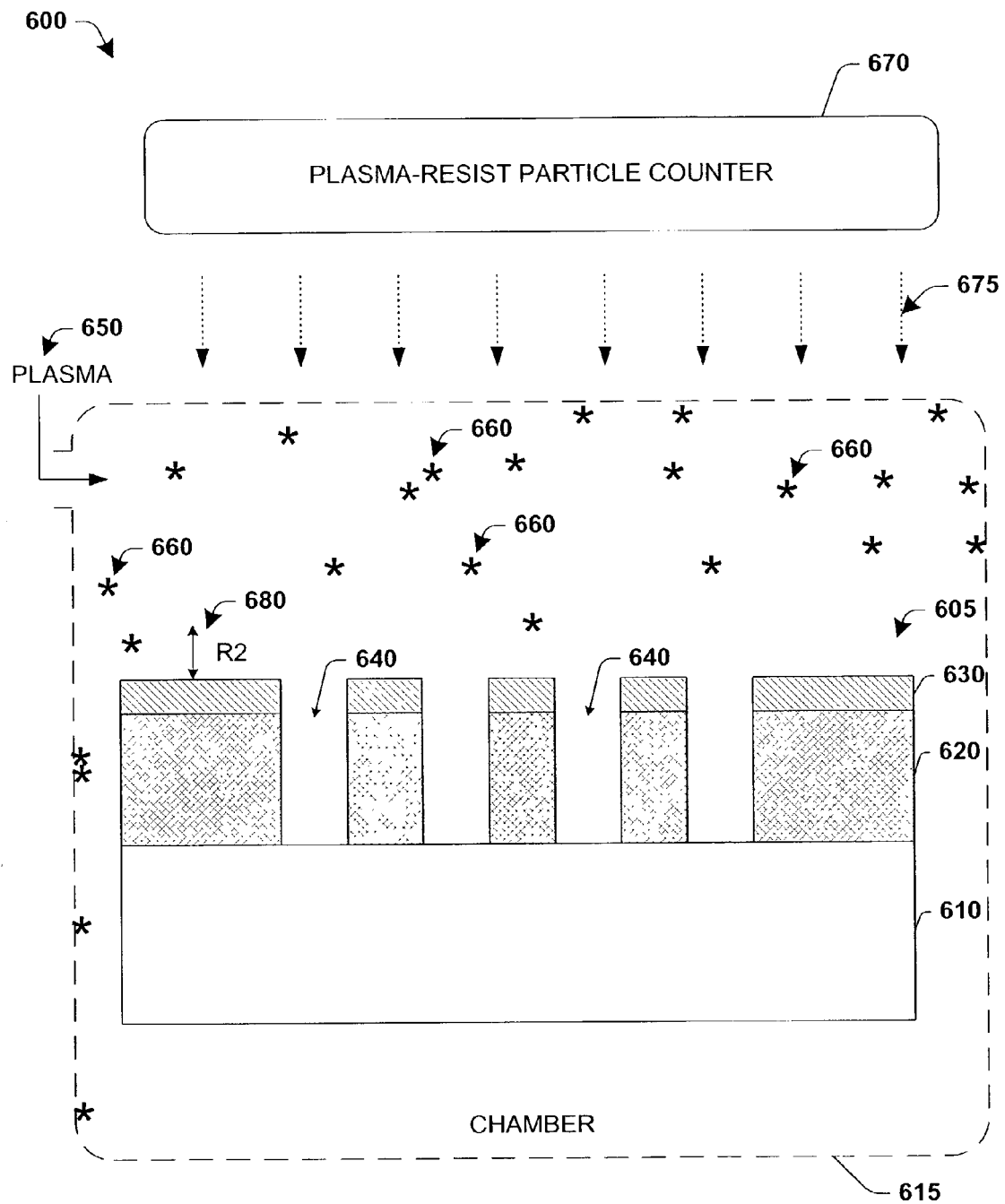
FIG. 6 illustrates a schematic, cross-sectional view of a semiconductor structure undergoing a process to strip the photoresist layer therefrom in a reaction chamber while a plasma particle counter is employed in real time in accordance with an aspect of the present invention.

FIG. 6 illustrates another aspect 600 of the present invention as the resist strip process progresses along. In particular, a semiconductor structure 605, which includes a substrate 610, one or more etched layers 620 over the substrate and a partially removed resist layer 630 over the etched layer 620, is housed within a reaction chamber 635, in which the resist strip process is taking place.

The resist layer 630 also has one or more openings 640 therethrough which extend through the etched layer 620 in order to expose an upper surface of the substrate 610. The resist layer 630 has been partially removed as indicated by a depth or length R2 680, such that R2 680 is greater than R1 580 (FIG. 5). Plasma 650 continues to be supplied into the chamber 635 in order to facilitate the removal of the resist layer 630 from the structure 605.

A plasma-resist particle counter 670 similar to the counter 570 of FIG. 5 continues to monitor 675 the chamber 635 in order to obtain a count of particles 660 undesirably contained in the chamber 635. As can be seen in FIG. 6, more particles 660 remain in the chamber 635 as the resist strip process progresses and as more of the resist layer 630 is removed.

Figure 7:
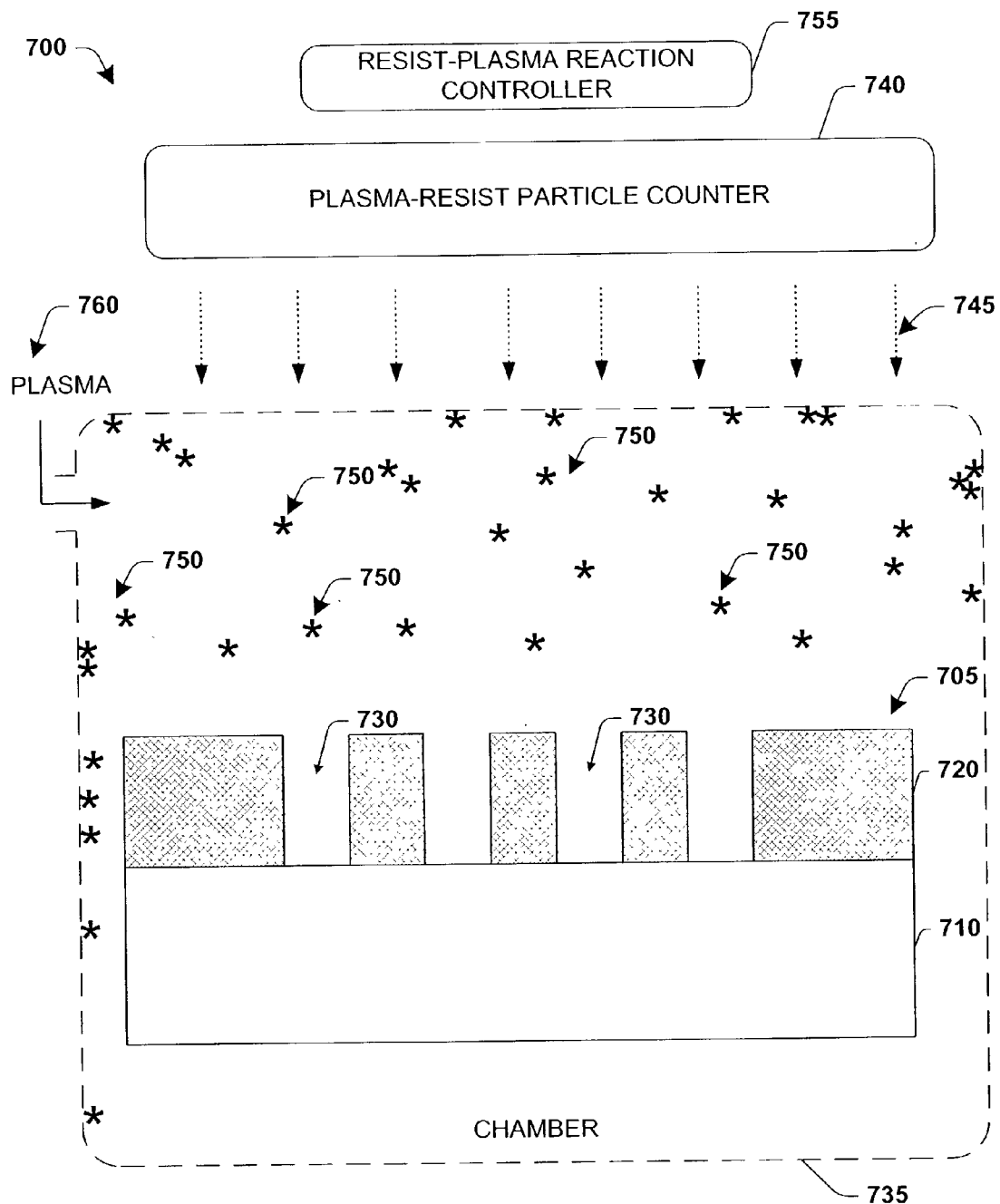
FIG. 7 illustrates a schematic, cross-sectional view of a semiconductor structure undergoing a resist strip process in a reaction chamber wherein the reaction chamber demonstrates an intolerable amount of particles in accordance with an aspect of the present invention.

FIG. 7 illustrates a yet another aspect of the system 700 for controlling defect formation during a resist strip process. In particular, the system 700 includes a semiconductor structure 705 having a substrate 710 and an etched layer 720, wherein the etched layer 720 includes one or more features 730 formed therein. As a result of the resist strip process, a resist layer similar to the resist layer 630 of FIG. 6 has been substantially removed from the structure 705. The semiconductor structure is housed in a reaction chamber 735 wherein the resist strip process may occur.

A plasma-resist particle counter 740 continues to obtain 745 a count of particles 750 present in the chamber 735. Likewise, one or more components (not shown) of the resist strip process continue to perform their functions until they are instructed to terminate. Instructions to the components may be provided by a plasma-resist reaction controller 755. The plasma-resist reaction controller 755 is operatively connected to the plasma-resist particle counter 740 (FIG. 2) such that it may receive a continuous feed of particle data in real time as the resist strip process occurs.

Because the particles 750 present in the chamber after the resist layer has been substantially removed exceed a particle amount which is tolerable to the structure 705, plasma 760 continues to flow into the chamber 735 either at a constant rate or at a variable rate. More specifically, the controller 755 instructs the resist strip process, and in particular, the plasma component, to remain on for continued flowing into the chamber 735. The continued plasma flow 760 into the chamber 735 and resulting exposure to the structure 705 stabilizes the particles 750 such that they are transformed into a form which is expellable by the chamber 735.

Figure 8:
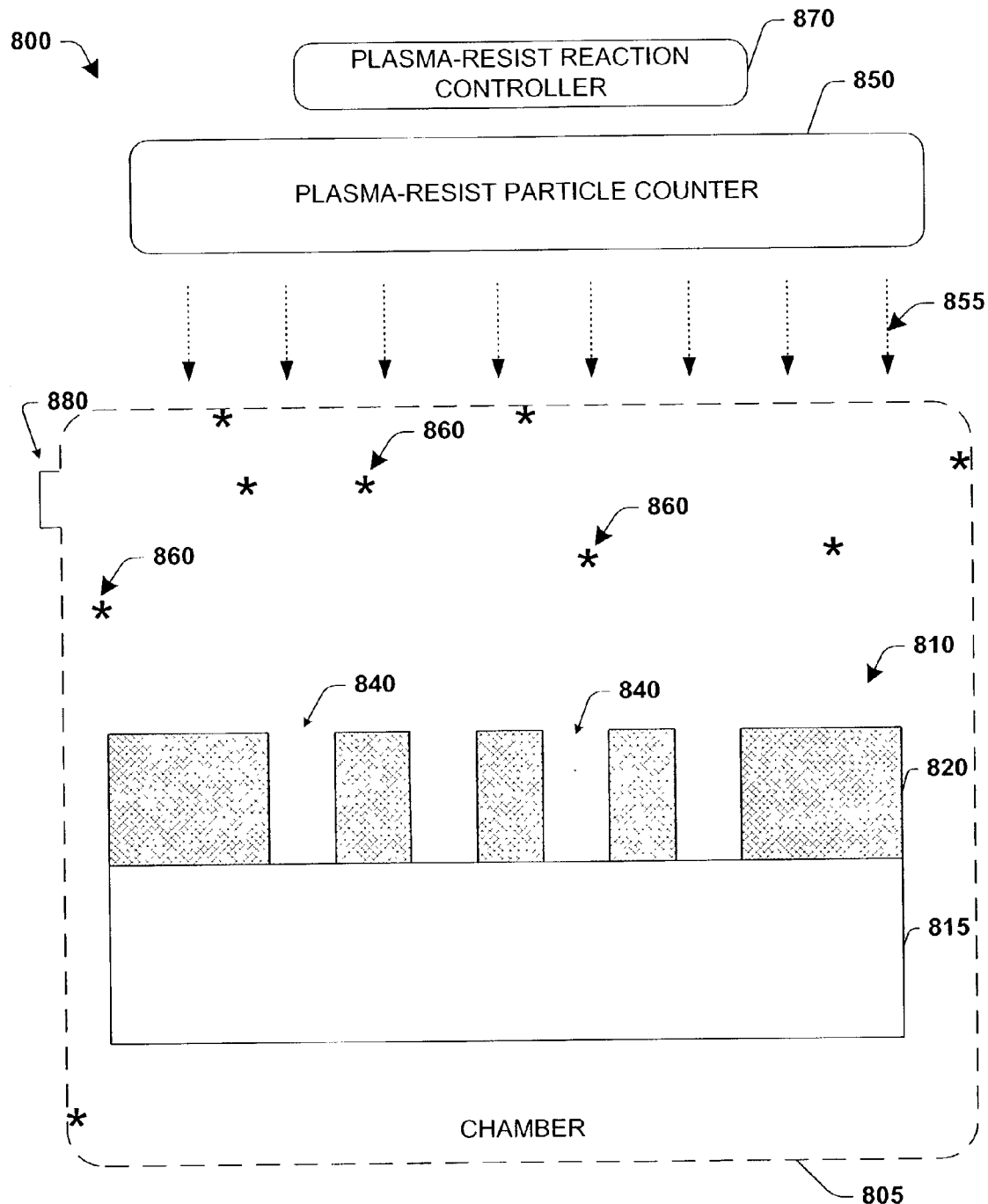
FIG. 8 illustrates a schematic, cross-sectional view of a semiconductor structure in a reaction chamber in real time after extending a resist strip process reaction time in accordance with an aspect of the present invention.

FIG. 8 depicts an exemplary system 800 for controlling defect formation during a resist strip process wherein particles 860 in a chamber 805 have been substantially reduced.

The chamber also includes a partially fabricated semiconductor structure 810 having a silicon substrate 815 and an etched layer 820 thereon. The etched layer comprises one or more features 840 formed therein.

As previously discussed, a plasma-resist particle counter 850 continuously monitors 855 the chamber 805 in order to ascertain the number of particles 860 present in the chamber 805. The particle count is immediately communicated to plasma-resist reaction controller 870. If the particle count exceeds a tolerable level of particles for the specific device being manufactured, plasma is instructed to continue to flow into the chamber 805 until a particle count falling within the tolerable level is realized by the particle counter 850.

According to FIG. 8, the number of particles 860 remaining in the chamber 805 is substantially lower than as shown in FIGS. 5–7, thereby demonstrating that a required amount of the particles have been successfully evacuated from the chamber 805 as desired. The particle counter 850 determines that the present number of particles 860 in the chamber 805 is below the intolerable level and thus, the resist strip process, and in particular, the plasma component, is terminated. Accordingly, a valve 880 for the plasma has been closed.

Figure 9:
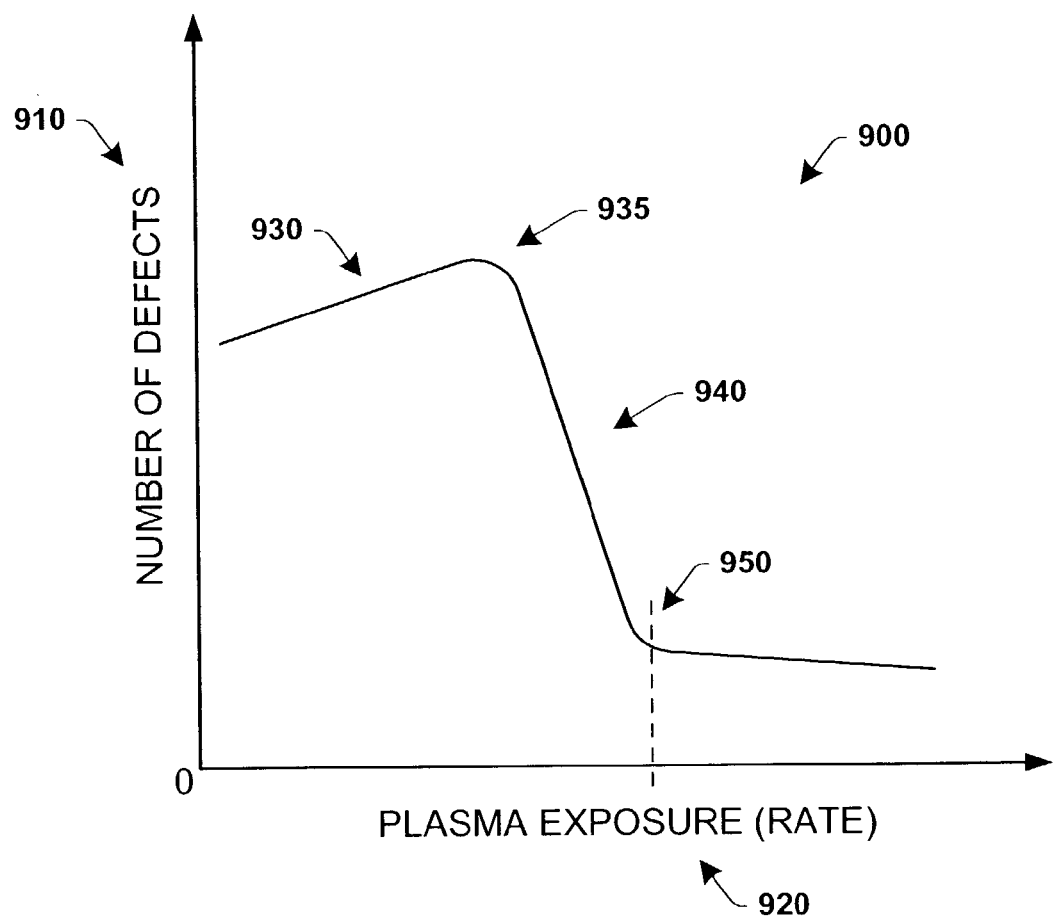
FIG. 9 illustrates an exemplary graphical plot indicating an inverse relationship between a number of defects in a reaction chamber and an amount of plasma applied over time in a resist strip process in accordance with an aspect of the present invention.

FIG. 9 depicts a graphical display 900 of a relationship between a number of defects or particles 910 and a plasma exposure rate 920 over time with respect to a resist strip process. In particle, as the resist strip process begins and progresses, the number of defects present in the reaction chamber increases 930. However, as the plasma exposure is prolonged or extended beyond what is necessary to strip the resist from the semiconductor structure (935), the number of defects decreases dramatically (940) to a quantity tolerable by the structure (950). At this point, the plasma may be terminated immediately and the structure may proceed to subsequent fabrication stages.

Figure 10:
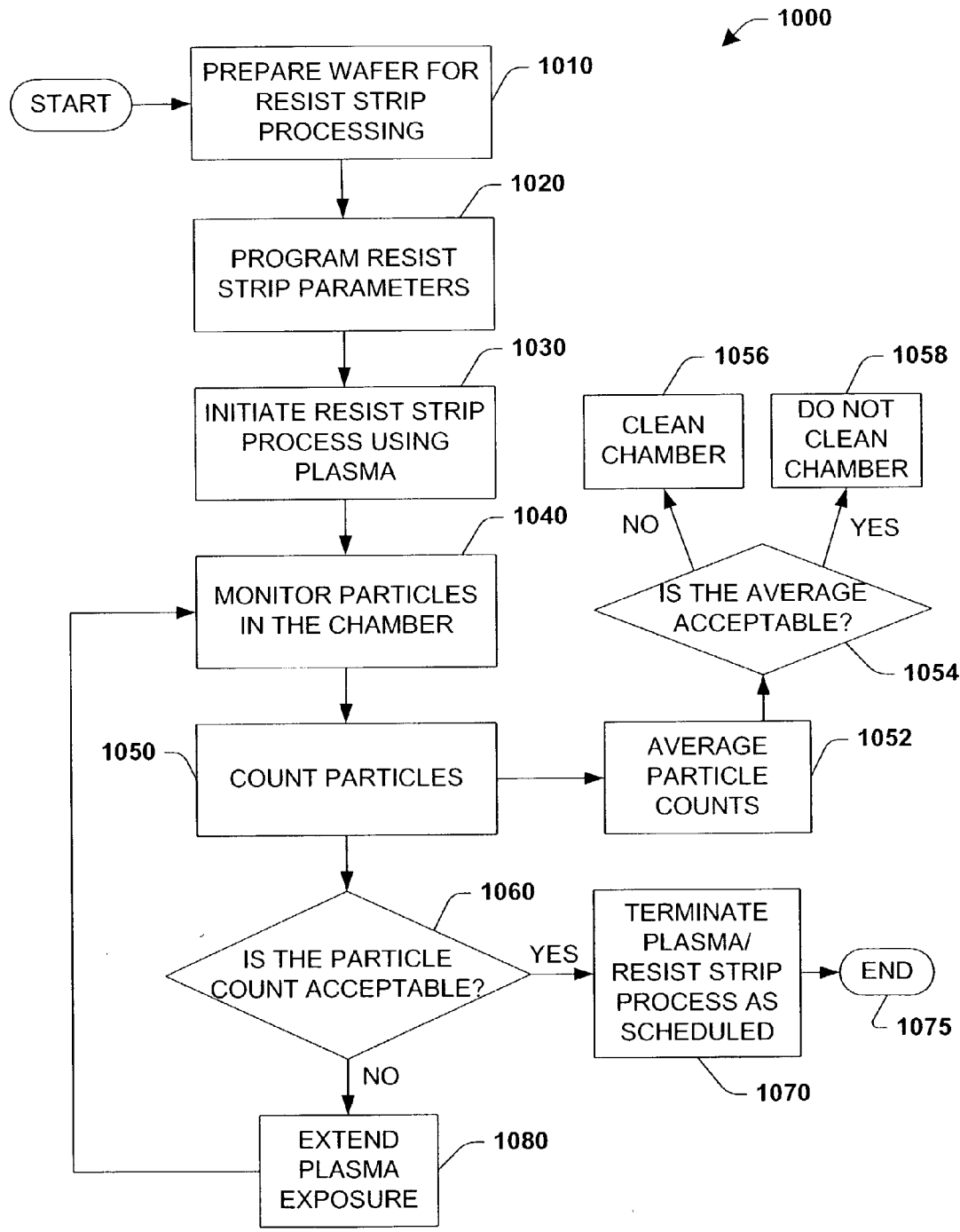
FIG. 10 illustrates an exemplary method for controlling defect formation during a resist strip process in real time in accordance with an aspect of the present invention.

Turning now to FIG. 10, a flow diagram of an exemplary method 1000 of controlling defect formation during a resist strip process, as pictorialized in FIGS. 1–8, is shown. In particular, the method 1000 involves monitoring particles present and/or being formed in a chamber in which the resist strip process is taking place. The resist strip process removes at least a portion of a photoresist layer from a semiconductor structure or wafer using a plasma material.

Monitoring the particles in the chamber may be accomplished in part by counting them using a particle counter which has been programmed to be sensitive to such particles comprising resist and plasma materials. The plasma material reacts with the resist material in such a way that the resist material is lifted from the semiconductor structure and expelled from the chamber. However, because some resist particles do not react properly with the plasma, particles comprising of resist and plasma materials float about and/or adhere to portions of the chamber and eventually to exposed portions of the semiconductor structure. These particles become undesirable defects when adhered to the structure. If too many particles (e.g., defects) are present in the chamber, the structure cannot tolerate them and/or function as needed. Thus, a continued or over exposure to plasma even after the resist layer has been substantially removed from the semiconductor structure may be employed in order to stabilize the free-floating particles into a form expellable by the chamber.

The method 1000 may be accomplished in part by employing a particle monitoring system. For example, a wafer or semiconductor structure is prepared to undergo the resist strip process (at 1010). In addition, one or more resist strip parameters may be programmed at 1020. Examples of the parameters include any one of plasma type, pressure, flow rate, temperature, power, and time duration. Next, the resist strip process is initiated in a reaction chamber in order to remove at least a portion of the photoresist layer from the semiconductor structure at 1030. At 1040, the particle monitoring system monitors for particles in the chamber.

When particles are detected, a particle counter is employed at 1050 to count the particles. The particles comprise resist and plasma materials and/or other materials which arise from the resist strip process. The particle counter provides the particle counts in real time to a particle analyzer and/or reaction controller, either of which determine whether the most recent or most current particle count exceeds a tolerable level of particles for the particular device being made. Because the particle count is a real time reflection of the chamber, data relating to the particle count can be generated and communicated to other system components of the resist strip process in an immediate fashion. After at least two particle counts have been obtained during the resist strip process, an average of the particle counts may be performed at 1052 in order to determine if the chamber requires a cleaning prior to a subsequent resist strip process. If the average particle count is acceptable at 1054, then an audible, visual and/or electronic signal is provided to indicate that the chamber is to be cleaned at 1056 prior to the subsequent resist strip process. On the other hand, if the average particle count is acceptable, then another signal can be provided at 1058 to indicate that the chamber may continue for use in the subsequent resist strip process.

Referring back to 1050, if the particle count is acceptable at 1060, then the reaction controller instructs one or more components of the resist strip process to terminate the plasma flow and/or the resist strip process according to the pre-set parameters (at 1070). The method then ends at 1075. However, if the particle count is not acceptable and/or tolerable by the semiconductor structure, then the reaction controller signals the one or more resist strip process components to modify the plasma exposure time. For instance, if the particle count obtained after the resist layer has been substantially removed indicates that the particles in the chamber are at an intolerable level, the controller instructs the plasma flow to continue (at 1080). Termination of the plasma flow depends on particle counts which are subsequently obtained and analyzed. Thus, after the plasma flow is modified, the method returns to about 1040 where the particles in the chamber are monitored again and subsequently counted.

Although the invention has been shown and described with respect to several aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for real time reduction of defect formation during a resist strip process in a reaction chamber comprising:
   forming a patterned resist layer over a semiconductor structure, the patterned resist layer having one or more openings therethrough;
   etching the semiconductor structure through one or more openings of the patterned resist layer in order to form at least one feature in the semiconductor structure;
   exposing the patterned resist layer to a plasma material in order to strip at least a portion of the resist layer from the semiconductor structure;
   monitoring particles in the reaction chamber while exposing the patterned resist layer to the plasma material to provide particle count feedback; and
   continuously exposing the semiconductor structure to the plasma material in order to obtain a desired reduction of defects in the chamber based on the particle count feedback.

2. The method of claim 1, further comprising tracking the counted particles relative to the plasma material flowing into the reaction chamber in order to project an end point for the resist strip process.

3. The method of claim 1, wherein the continued exposure to the plasma material stabilizes the particles in the reaction chamber such that the reduction of defects in the chamber is realized.

4. The method of claim 1, wherein the particles comprise at least one of a resist material and a plasma material.

5. The method of claim 1, wherein monitoring the particles in the reaction chamber comprises counting the particles in the chamber and comparing the particles count to a desired particle count that is tolerable by the semiconductor structure.

6. The method of claim 1, further comprising using a reaction controller to signal one or more resist strip process components coupled to the reaction chamber to continue exposing the semiconductor structure to the plasma material until the particles counted are reduced to at least a desired particle count.

7. The method of claim 6, wherein the process components comprise at least one of plasma type, temperature, pressure, flow rate, exposure time, and power.

8. The method of claim 1, wherein the particles counted in the reaction chamber correspond to an amount of defects present in the chamber.

9. The method of claim 1, wherein the reaction chamber comprises a valve opening in order to permit the plasma to enter the chamber.

10. The method of claim 1, further comprising terminating the resist strip process when a desired reduction of the particles in the reaction chamber is obtained.

11. The method of claim 1, wherein the particles in the reaction chamber result from interactions between the plasma material and the resist layer being removed.

12. The method of claim 1, wherein the intolerable amount of particles in the reaction chamber is predetermined by a user and is dependent upon a desired application of the semiconductor structure.

13. The method of claim 1, further comprising providing a signal to indicate that the reaction chamber is to be cleaned prior to a subsequent resist strip process.

14. The method of claim 13, wherein the signal is provided when an average particle count of particles in the chamber measured during a resist strip process is higher than an acceptable average particle count for the chamber.

* * * * *